United States Patent
Tominaga et al.

(10) Patent No.: US 10,303,062 B2
(45) Date of Patent: May 28, 2019

(54) METHOD OF MANUFACTURING STRUCTURE AND METHOD OF MANUFACTURING LIQUID EJECTION HEAD

(71) Applicant: CANON KABUSHIKI KAISHA, Tokyo (JP)

(72) Inventors: Yasuaki Tominaga, Kawasaki (JP); Tetsushi Ishikawa, Tokyo (JP); Manabu Otsuka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/660,632

(22) Filed: Jul. 26, 2017

(65) Prior Publication Data

US 2018/0031980 A1 Feb. 1, 2018

(30) Foreign Application Priority Data

Jul. 29, 2016 (JP) .................. 2016-150410

(51) Int. Cl.
*G03F 7/20* (2006.01)
*G03F 7/09* (2006.01)
*B41J 2/16* (2006.01)
*B41J 2/14* (2006.01)

(52) U.S. Cl.
CPC ........ *G03F 7/70058* (2013.01); *B41J 2/1404* (2013.01); *B41J 2/162* (2013.01); *B41J 2/1603* (2013.01); *B41J 2/1628* (2013.01); *B41J 2/1629* (2013.01); *B41J 2/1631* (2013.01); *B41J 2/1634* (2013.01); *B41J 2/1642* (2013.01);
(Continued)

(58) Field of Classification Search
CPC ........ B41J 2/1404; B41J 2/1603; B41J 2/162; B41J 2/1628; B41J 2/1629; B41J 2/1631; B41J 2/1634; B41J 2/1642; B41J 2/1646; B41J 2002/14467; G03F 7/091; G03F 7/2008; G03F 7/70058; G03F 7/703
USPC .................... 355/67, 77; 430/311, 322, 950
See application file for complete search history.

(56) References Cited

U.S. PATENT DOCUMENTS

| | | | | |
|---|---|---|---|---|
| 5,126,289 A | * | 6/1992 | Ziger | G03F 7/091 257/E21.027 |
| 2007/0070122 A1 | * | 3/2007 | Bertelsen | B41J 2/1433 347/44 |

(Continued)

FOREIGN PATENT DOCUMENTS

JP 2006-227544 A 8/2006

OTHER PUBLICATIONS

Rehg et al, "Solgel derived tantalum pentoxide films as ultraviolet antireflective coatings for silicon;" Applied Optics, Dec. 15, 1989; 28(24):5215-21.*

*Primary Examiner* — Colin W Kreutzer
(74) *Attorney, Agent, or Firm* — Canon U.S.A. Inc., IP Division (57) ABSTRACT

A method of manufacturing a structure including a substrate and a photosensitive resin layer provided on the substrate includes irradiating a region of the photosensitive resin layer with light in a state where a layer is provided on a surface of the substrate, the region being located above a space surrounded by the substrate and the photosensitive resin layer, and the surface facing the space, and removing a portion of the photosensitive resin layer located above the space to form a hole, wherein the provided layer has a reflectance of 40% or less with respect to the light.

15 Claims, 7 Drawing Sheets

(52) U.S. Cl.
CPC ............ *B41J 2/1646* (2013.01); *G03F 7/091* (2013.01); *G03F 7/2008* (2013.01); *B41J 2002/14467* (2013.01)

(56) References Cited

U.S. PATENT DOCUMENTS

| | | | |
|---|---|---|---|
| 2010/0033536 A1* | 2/2010 | Lee ........................ | B41J 2/1603 347/47 |
| 2010/0110142 A1* | 5/2010 | Kwon .................... | B41J 2/1603 347/44 |
| 2010/0128091 A1* | 5/2010 | Kwon .................. | B41J 2/14032 347/63 |
| 2010/0229392 A1* | 9/2010 | Bell ....................... | B41J 2/1603 29/890.1 |

* cited by examiner

METHOD OF MANUFACTURING STRUCTURE AND METHOD OF MANUFACTURING LIQUID EJECTION HEAD

BACKGROUND OF THE INVENTION

Field of the Invention

The present disclosure relates to a method of manufacturing a structure and a method of manufacturing a liquid ejection head.

Description of the Related Art

In microelectromechanical systems (MEMS) processing and some semiconductor device processing, through holes and non-through holes are formed in substrates. For example, in a process of manufacturing a liquid ejection head such as an ink jet head, supply openings which are through holes are formed in a substrate made of a material such as silicon. On the substrate, a channel forming member for forming channels and an ejection opening forming member for forming ejection openings are provided as the structure. In some cases, the channel forming member forms the ejection openings. An energy generation element which generates energy for ejecting liquid is provided on the substrate, and the energy is applied to the liquid to eject the liquid from the ejection openings.

A method of manufacturing such a structure is discussed in Japanese Patent Application Laid-Open No. 2006-227544 in which a photosensitive resin film is attached on a substrate including a fine depressed portion and is exposed and developed to form a structure on the substrate. This method is so-called photolithography.

SUMMARY OF THE INVENTION

According to an aspect of the present disclosure, a method of manufacturing a structure including a substrate and a photosensitive resin layer provided on the substrate includes irradiating a region of the photosensitive resin layer with light in a state where a layer is provided on a surface of the substrate, the region being located above a space surrounded by the substrate and the photosensitive resin layer, and the surface facing the space, and removing a portion of the photosensitive resin layer located above the space to form a hole, wherein the provided layer has a reflectance of 40% or less with respect to the light.

Further features of the present disclosure will become apparent from the following description of exemplary embodiments with reference to the attached drawings.

DESCRIPTION OF THE EMBODIMENTS

Figure 7A:
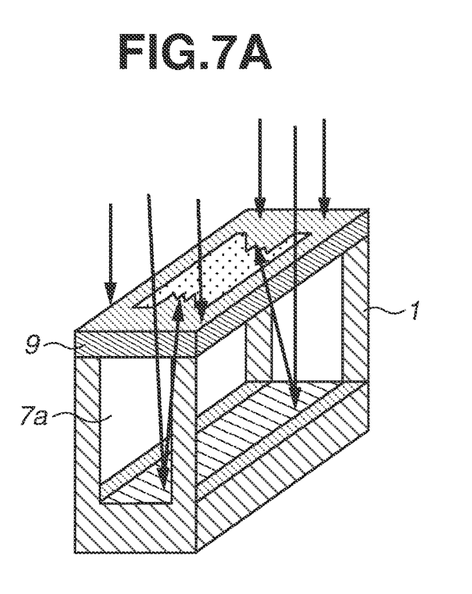
FIGS. 7A and 7B illustrate the relationship between the reflection of light and the shape of a photosensitive resin layer.
Figure 7B:
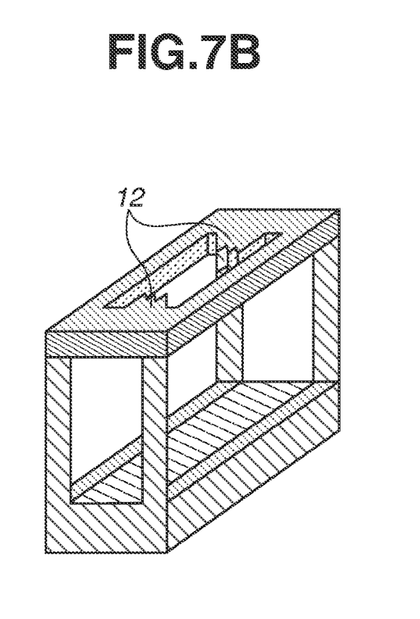

The method discussed in Japanese Patent Application Laid-Open No. 2006-227544 sometimes fails to form channels and ejection openings in desired shapes depending on the shape of a substrate. Extensive and intensive studies were conducted to find out the cause of the failure. As a result, it was found that when a photosensitive resin film was exposed, light was reflected from a space (depressed portion) formed in the substrate, and a region of the photosensitive resin film that was not supposed to be exposed was exposed by the reflected light to cause the change in shape. FIGS. 7A and 7B illustrate how the reflection of the light occurs. Between a substrate 1 and a photosensitive resin layer (photosensitive resin film) 9 a space 7a is formed. As illustrated in FIG. 7A, the light is reflected from bottom and side surfaces of the space 7a. As a result, as illustrated in FIG. 7B, unintended regions 12 are exposed, and the exposed regions remain after the developing. Thus, a hole in the photosensitive resin layer 9 is not formed in a desired shape. Accordingly, it becomes difficult to obtain a structure with high accuracy.

The present disclosure is directed to a technique for forming a hole with high accuracy even in a case where the structure is formed by making the hole using photolithography in a photosensitive resin layer covering a depressed portion of the substrate.

The following describes a method of manufacturing a structure according to an exemplary embodiment. The structure to be manufactured includes a liquid ejection head as an example. The disclosed method is also applicable to microelectromechanical systems (MEMS) processing and some of semiconductor device processing.

Figure 1:
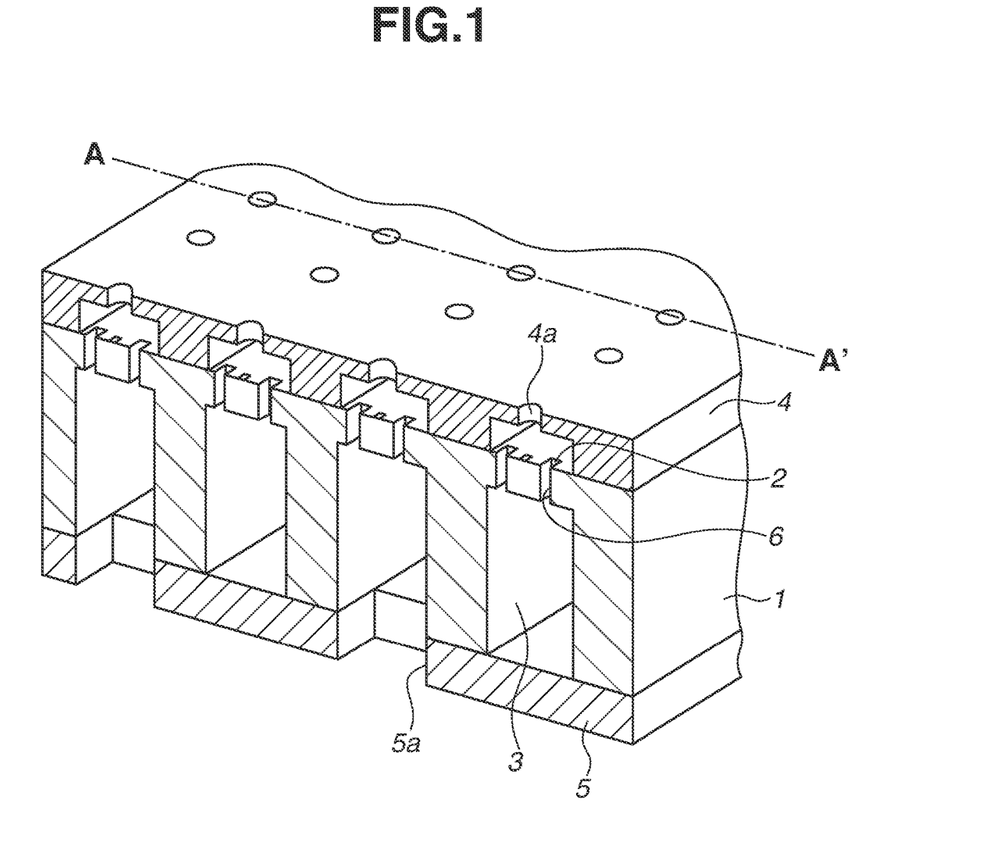
FIG. 1 illustrates the configuration of a liquid ejection head.

FIG. 1 illustrates the configuration of a liquid ejection head as an example of the structure manufactured. The liquid ejection head includes the substrate 1, energy generation elements 2, and an ejection opening forming member 4 for forming ejection openings 4a for ejecting liquid. The energy generation elements 2 and the ejection opening forming member 4 are provided on the substrate 1. The energy generation elements 2 generate energy which is used to eject liquid, such as ink. The substrate 1 is made of, for example, silicon. Examples of the energy generation elements 2 include a heat generating resistive element and piezoelectric member. The ejection opening forming member 4 can be made of a photosensitive resin or an inorganic material such as SiN or SiC.

The substrate 1 includes first supply openings 3 and second supply openings 6 for supplying liquid, and the first supply openings 3 and the second supply openings 6 form through-holes which pass through the substrate 1. A cover structure 5 is provided on a rear surface of the substrate 1 which is the surface opposite to a front surface (surface on which the energy generation elements 2 are formed) of the substrate 1. The cover structure 5 is a structure that covers a part of the first supply openings 3. The cover structure 5 is made of a photosensitive resin and includes in some portions holes 5a formed by using photolithography.

Figure 2A:
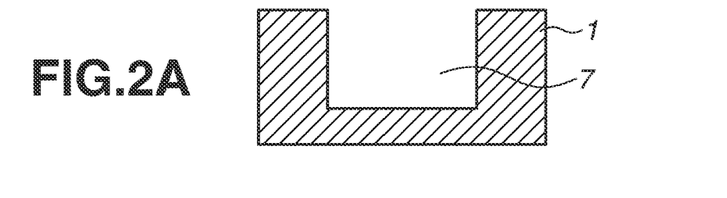
FIGS. 2A to 2E illustrate a method of manufacturing a structure.

The following describes a method of manufacturing a structure with reference to FIGS. 2A to 2E. First, as illustrated in FIG. 2A, the substrate 1 including a depressed portion 7 is prepared. The substrate 1 is desirably a silicon substrate made of silicon, more desirably a substrate made of monocrystalline silicon. The depressed portion 7 is a portion corresponding to the first supply openings 3 of the liquid ejection head in FIG. 1. A method of forming the depressed portion 7 includes dry etching such as reactive ion etching, and wet etching (anisotropic etching) using tetramethylammonium hydroxide aqueous solution as an example.

Figures 2B, 2C:
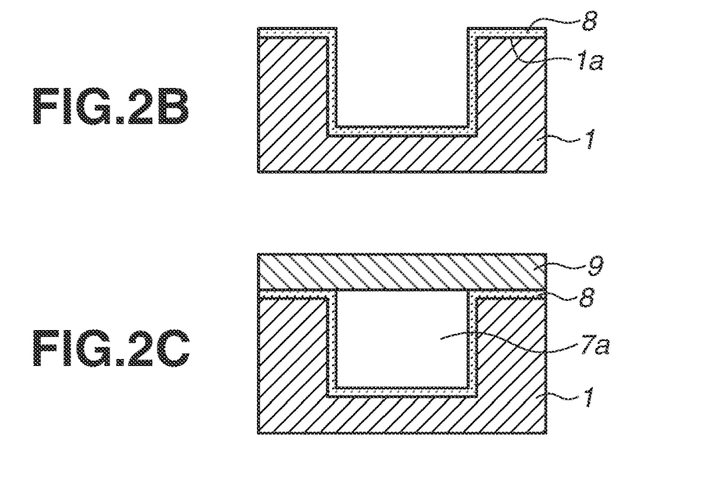

Next, as illustrated in FIG. 2B, a layer 8 is formed to coat the depressed portion 7. While the layer 8 may be provided to coat the depressed portion 7, the layer can also be provided on a front surface 1a of the substrate 1 as illustrated in FIG. 2B. As described below, the layer 8 is a layer which reduces reflection of irradiation light, with which a photosensitive resin layer formed in a subsequent step is irradiated, from the substrate 1 side. Therefore, the layer 8 is a layer having a reflectance of 40% or less with respect to the irradiation light with which the photosensitive resin layer is irradiated. The reflectance is a value obtained as a result of interference of reflected light from a front surface of the layer 8 and reflected light from an interface between the substrate 1 and the layer 8.

The refractive index of the layer 8 with respect to the light with which the layer 8 is to be irradiated later is desirably 1.5 or larger. Thus, the layer 8 is desirably made of an inorganic compound containing at least one element selected from oxygen, nitrogen, and carbon. Especially, the layer 8 is desirably made of at least one of titanium oxide, zirconium oxide, hafnium oxide, vanadium oxide, niobium oxide, and tantalum oxide. The layer 8 may include one layer to coat the depressed portion 7 or two or more layers to coat the depressed portion 7. In the case in which the layer 8 includes two or more layers, the refractive index of the layer 8 is the sum of the refractive indices of the two or more layers. The layer 8 desirably coats 80% or more of the surface area of the depressed portion 7, more desirably 90% or more of the surface area of the depressed portion 7, yet more desirably an entire exposed portion of the depressed portion 7.

Examples of a method of forming the layer 8 include sputtering, chemical vapor deposition (CVD), and atomic layer deposition (ALD). ALD is especially desirable because it enables coating of a high-aspect or complicated shape with a layer having a highly uniform thickness.

The thickness of the layer 8 is desirably 10 nm or greater. Having a thickness of 10 nm or greater, the layer 8 coats the depressed portion 7 with improved coatability. Further, the thickness of the layer 8 is desirably 700 nm or less. If the layer 8 is thicker than 700 nm, reflected light from the interface between the substrate 1 and the layer 8 is difficult to obtain under the effect of the extinction coefficient, so interference is less likely to occur. This makes it difficult to reduce reflected light. Further, it may take a longer time to form the layer 8. Further, the thickness of the layer 8 is desirably 200 nm or less. Having a thickness of 200 nm or less, the layer 8 can be easily adjusted to have a uniform thickness throughout the layer 8, which prevents variations in reflectance between different portions of the layer 8, making it easy to control the reflection.

Next, as illustrated in FIG. 2C, the photosensitive resin layer 9 is provided on the substrate 1 to cover the depressed portion 7. The photosensitive resin layer 9 is desirably a dry film and does not have to cover the entire depressed portion 7. The depressed portion 7 is formed into the space 7a surrounded by the substrate 1 and the photosensitive resin layer 9. The layer 8 is provided on a surface of the substrate 1 that faces the space 7a. The photosensitive resin layer 9 is desirably formed in such a manner that the photosensitive resin layer 9 is formed on a base film, laminated on the substrate 1, and the base film is removed. Examples of a method of forming the photosensitive resin layer 9 on the base film include spin coating, die coating, and spray coating. Further, examples of a resin used in the base film include polyethylene, polypropylene, polyethylene terephthalate, polyethylene naphthalate, polyamide, polyimide, and perfluoroalkoxy fluororesin. Other examples include a tetrafluoroethylene-hexafluoropropylene copolymer, ethylene-tetrafluoroethylene copolymer, cycloolefin polymer, and cycloolefin copolymer. Desirably, surface treatment is conducted on the base film to improve coating properties and removability of the photosensitive resin layer 9. While the base film is not illustrated, the removal of the base film can be conducted after the irradiation of the photosensitive resin layer 9 with light.

The photosensitive resin layer 9 is desirably a negative photosensitive resin layer containing a negative photosensitive resin, because the photosensitive resin layer 9 will constitute a portion of a channel later as a cover structure. Examples of a negative photosensitive resin include a negative photosensitive resin composition made by using radical polymerization reaction and a negative photosensitive resin composition made by using cationic polymerization reaction. The negative photosensitive resin composition made by using radical polymerization reaction is cured as polymerization or crosslinking between molecules of radical-polymerizable monomers or prepolymers contained in the composition is developed by radicals produced from a photopolymerization initiator contained in the composition. Examples of a photopolymerization initiator include benzoins, benzophenones, thioxanthones, anthraquinones, acylphosphinoxides, titanocenes, and acridines. Examples of a radical-polymerizable monomer include monomers or prepolymers having an acryloyl group, methacryloyl group, acrylamide group, diester maleate, or allyl group. The negative photosensitive resin composition made by using cationic polymerization reaction is cured as polymerization or crosslinking between molecules of cation-polymerizable monomers or prepolymers contained in the composition is developed by cations produced from a cationic photopolymerization initiator contained in the composition. Examples of a cationic photopolymerization initiator include an aromatic iodonium salt and aromatic sulfonium salt. Examples of a cation-polymerizable monomer or prepolymer include monomers and prepolymer having an epoxy group, vinyl ether group, or oxetane group. The negative photosensitive resin compositions can be used singly or in combination of two or more. Further, an additive can be added as appropriate when needed. Further, "SU-8 series", "KMPR-1000" (product names, manufactured by Nippon Kayaku Co., Ltd.), "TMMR S2000", "TMMF S2000" (product names, manufactured by TOKYO OHKA KOGYO CO., LTD.), etc. can be used as the negative photosensitive resin composition.

Figure 2D:
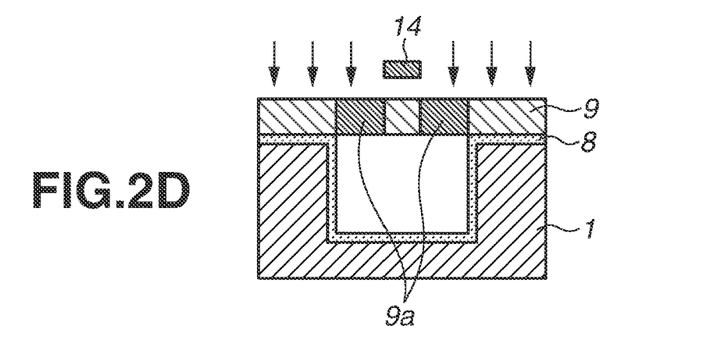

After the photosensitive resin layer 9 is formed on the substrate 1, a region of the photosensitive resin layer 9 that is located above the space 7a surrounded by the substrate 1 and the photosensitive resin layer 9 is irradiated with irradiation light while the layer 8 is provided on the surface of the substrate 1 that faces the space 7a, as illustrated in FIG. 2D. The region of the photosensitive resin layer 9 that is located above the space 7a and is irradiated with the irradiation light is a region 9a. A region of the photosensitive resin layer 9 that is located above the space 7a and is not irradiated with the irradiation light is covered by a mask 14. The irradiation light can be any light that can cure the photosensitive resin layer 9. Examples of such light include ultraviolet radiation, visible light, infrared radiation, X-rays, and gamma rays. Among the examples, ultraviolet radiation is desirably used. Especially an i-line having a wavelength of 365 nm is desirable. Further, the exposure amount can be any amount that is sufficient to cure the photosensitive resin layer 9. Further, after the light irradiation, heating can be conducted to cure the photosensitive resin layer 9. In a case in which the base film is made of a material that is likely to shield the irradiation light, it is desirable to conduct the light irradiation after the base film is removed. On the other hand, in a case in which the base film is made of a material that is likely to transmit the irradiation light, the light irradiation can be conducted either before or after the base film is removed.

When the light irradiation is performed as illustrated in FIG. 2D, the layer 8 is provided on the surface of the substrate 1 that faces the space surrounded by the substrate 1 and the photosensitive resin layer 9. The reflectance of the layer 8 with respect to the irradiation light with which the photosensitive resin layer 9 is irradiated in FIG. 2D is 40% or less. In other words, the layer 8 is a layer which reduces reflection of the irradiation light. This reduces exposure of an unintended portion of the photosensitive resin layer 9 as a result of reflection of the irradiation light, with which the photosensitive resin layer 9 is irradiated, from the surface of the substrate 1 that faces the space, as illustrated in FIGS. 7A and 7B.

Figure 3:
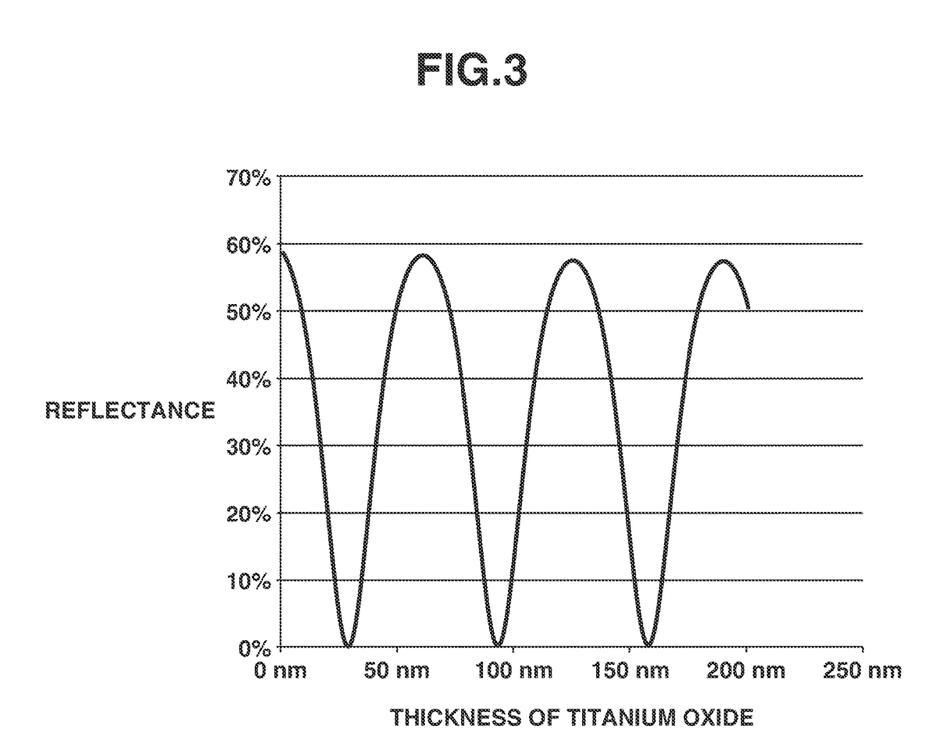
FIG. 3 illustrates the relationship between the layer thickness and reflectance.

FIG. 3 illustrates the relationship between the thickness of the layer 8 (titanium oxide) and the reflectance in a case in which titanium oxide is used as the layer 8 and the i-line having a wavelength of 365 nm is used as the irradiation light. FIG. 3 illustrates a case in which the layer 8 is one titanium oxide layer and a layer located below the layer 8 is the (100) plane of the silicon substrate. As illustrated in FIG. 3, the reflectance of the layer 8 varies depending on the thickness of the layer 8 due to interference of the reflected light from the front surface of the layer 8 and the reflected light from the interface between the substrate 1 and the layer 8. The material and thickness of the layer 8 are selected so that the reflectance including the interference is 40% or less. It is apparent that the layer located below the layer 8 (layer that is in contact with and located immediately below the layer 8) is not limited to the silicon substrate. Even if the member is made of a different material, the reflectance can be adjusted to 40% or less by selecting the material and thickness of the layer 8.

Figure 2E:
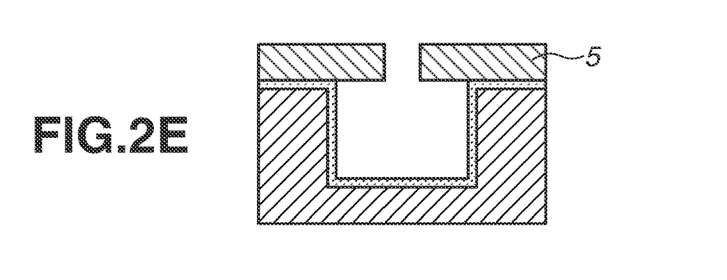

Next, as illustrated in FIG. 2E, a portion of the photosensitive resin layer 9 is removed using a developing solution. Examples of a developing solution include propyleneglycol-1-monomethylether-2-acetate. When the portion of the photosensitive resin layer 9 is removed, a hole 5a is formed. Thereafter, heating may be conducted as needed to cure the photosensitive resin layer 9. In this way, the structure is manufactured using the photosensitive resin layer 9 as the cover structure 5.

FIGS. 4A to 4F illustrate an example of applying the method of manufacturing the structure to a liquid ejection head. FIGS. 4A to 4F illustrate a process of manufacturing a liquid ejection head, each illustrating a cross section A-A' of the liquid ejection head illustrated in FIG. 1. Unless otherwise specified, the materials similar to those in the configurations that are already described above will be used.

Figure 4A:
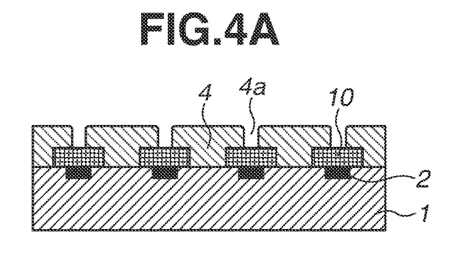
FIGS. 4A to 4F illustrate a method of manufacturing a liquid ejection head.

First, as illustrated in FIG. 4A, channel mold members 10 and the ejection opening forming member 4 are provided on the substrate 1 including the energy generation elements 2. The ejection opening forming member 4 coats the mold members 10 and forms the ejection openings 4a. Examples of the mold members 10 include a photosensitive resin, metal, and inorganic substance. Use of a positive photosensitive resin as the photosensitive resin is especially desirable. Examples of a positive photosensitive resin include a macromolecular main chain decomposition type photosensitive resin containing polymethyl isopropenyl ketone or methacrylic acid ester as a main component. The positive photosensitive resin layer is exposed to an optimum exposure wavelength for the material and then developed so that the positive photosensitive resin layer is formed in a desired pattern. Alternatively, a latent image of the channel shape may be formed on a dry film and developed later without forming the mold members 10 as described above. The ejection opening forming member 4 is made of a resin or an inorganic material such as SiN or SiC. Use of a photosensitive resin, especially a negative photosensitive resin, as the resin is desirable. Examples of a negative photosensitive resin composition include commercially-available "SU-8 series", "KMPR-1000" (product names, manufactured by Nippon Kayaku Co., Ltd.), "TMMR S2000", and "TMMF S2000" (product names, manufactured by TOKYO OHKA KOGYO CO., LTD.).

Further, examples of a method of forming the ejection opening forming member 4 to coat the mold members 10 include spin coating, laminating, and spray coating. In the case where the ejection opening forming member 4 is a photosensitive resin, the ejection openings 4a are formed by using photolithography. Besides photolithography, the ejection openings 4a can be formed by a laser or reactive ion etching.

Figure 4B:
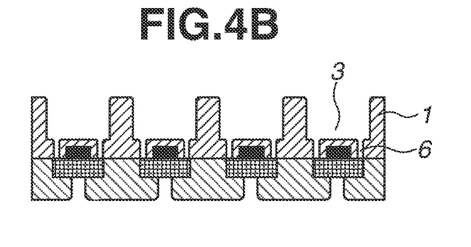

Next, as illustrated in FIG. 4B, the first supply openings 3 and the second supply openings 6 are formed in the substrate 1. In FIG. 4B, the first supply openings 3 and the second supply openings 6 are the depressed portion formed in the substrate 1. The first supply openings 3 and the second supply openings 6 are formed by using reactive ion etching, wet etching, etc.

Figure 4C:
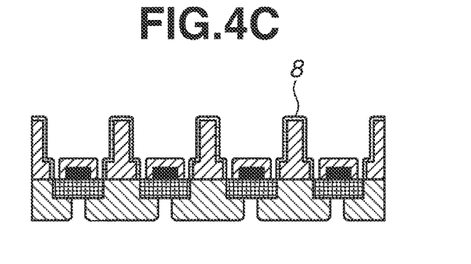

Next, as illustrated in FIG. 4C, the layer 8 is formed to coat the depressed portion. As described above, the layer 8 is formed by sputtering, CVD, ALD, etc. If the layer 8 is formed on a portion where the layer 8 does not have to be formed, the layer 8 can be removed by using a lift-off process, wet etching, dry etching, etc. If the layer 8 is formed also on an exposed surface of the mold members 10 through the second supply openings 6, the formed layer 8 can block the channels and the second supply openings 6 when the mold members 10 are removed. Thus, it is desirable to remove the layer 8 that is formed on the exposed surface of the mold members 10.

Figure 4D:
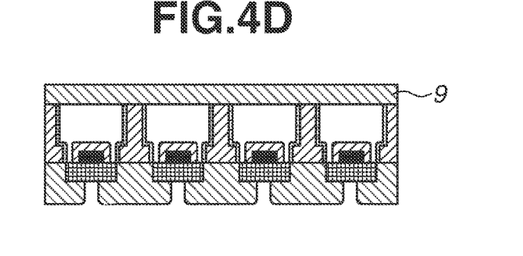
Figure 4E:
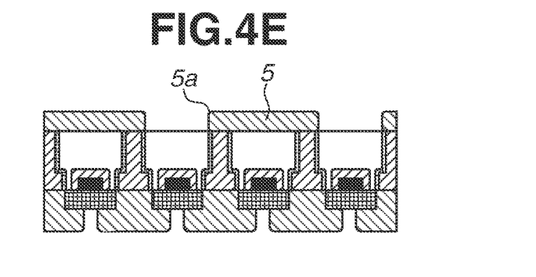

Next, as illustrated in FIG. 4D, the photosensitive resin layer 9 is provided on the substrate 1 to cover the depressed portion. Then, the photosensitive resin layer 9 is irradiated with the light and developed to form the cover structures 5 as illustrated in FIG. 4E. When the photosensitive resin layer 9 is irradiated with the light, the layer 8 functions as the layer which reduces reflection, so that the holes 5a are formed in a desired shape in the cover structures 5.

Figure 4F:
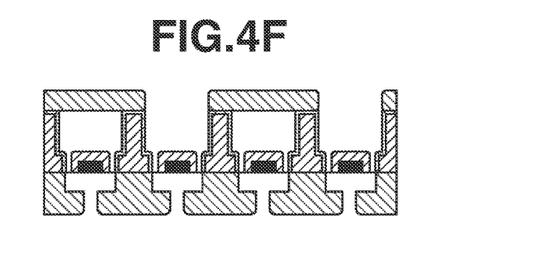

Lastly, the mold members 10 are developed to form the channels, and the liquid ejection head as illustrated in FIG. 4F is manufactured. As an example, the depressed portion and the cover structures 5 are formed in or on the substrate 1 after the ejection opening forming member 4 is formed. However, this can be carried out in reverse order, and the ejection opening forming member 4 can be formed after the depressed portion and the cover structures 5 are formed in or on the substrate 1.

Meanwhile, in the case where the layer 8 is used to reduce reflected light, the adhesion between the substrate 1 and the photosensitive resin layer 9 can decrease. For example, as illustrated in FIG. 2B, the layer 8 is provided also on the front surface 1a of the substrate 1, and the layer 8 on the front surface 1a has the same thickness as the thickness of the layer 8 that coats the depressed portion 7. At this time, reflected light from the depressed portion 7 side, i.e., the space 7a side, is reduced by the interference of light, but at the same time, reflected light on the front surface 1a is also reduced. The reflected light on the front surface 1a has little impact on the patterning accuracy of the photosensitive resin layer 9 above the depressed portion 7, i.e., the shape of holes in the structure. However, as to the adhesion between the photosensitive resin layer 9 and the substrate 1, the reduction in reflected light on the front surface 1a can lead to an insufficient amount of irradiation light (exposure amount) with which the photosensitive resin layer 9 on the front surface 1a is irradiated, and the adhesion between the substrate 1 and the photosensitive resin layer 9 may decrease. If the adhesion between the substrate 1 and the photosensitive resin layer 9 is low, the photosensitive resin layer 9 (cover structure 5) may be easily detached from the substrate 1.

Figure 5A:
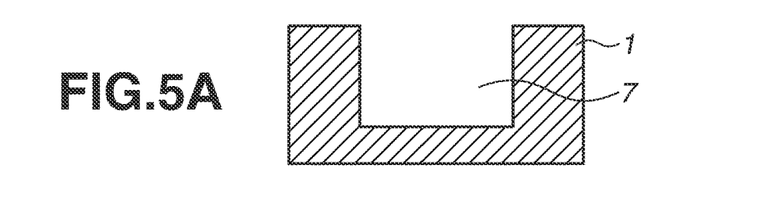
FIGS. 5A to 5E illustrate a method of manufacturing a structure.
Figure 5B:
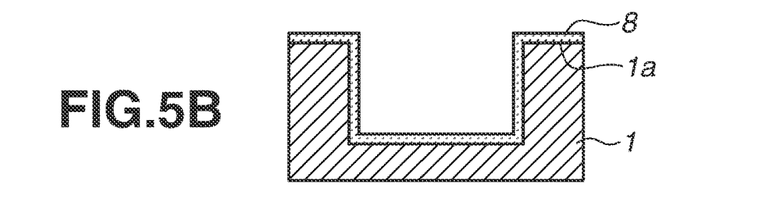

The following describes a method of providing another layer in addition to the layer 8 to prevent a decrease in adhesion between the substrate 1 and the photosensitive resin layer 9. FIGS. 5A to 5E illustrate the method. In FIGS. 5A and 5B, the layer 8 is formed to coat the depressed portion 7 as in FIGS. 2A and 2B.

Figure 5C:
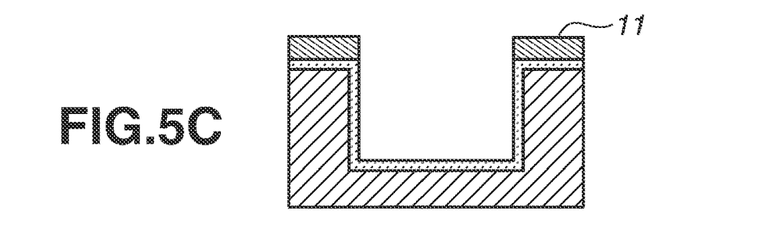

Next, as illustrated in FIG. 5C, a layer 11 is formed on the layer 8 on the front surface 1a. The layer 11 can be made of the same material as the material of the layer 8 or of a different material. The material and thickness of the layer 11 are selected such that the reflectance of the layer in which the layers 8 and 11 are laminated is higher than the reflectance of the layer 8 located in the depressed portion 7. The layer 11 is not formed in the depressed portion 7. Examples of a method of forming the layer 11 include sputtering, CVD, and ALD. ALD is especially desirable because it enables coating of a high-aspect or complicated shape with a layer having a highly uniform thickness. On the other hand, in order to selectively form the layer 11 not in the depressed portion 7 but on the front surface 1a, CVD is desirable. After the layer 11 is formed using any of the above-described methods, the layer 11 is removed as needed from a portion where the layer 11 does not have to be formed, such as the layer 11 within the depressed portion 7.

Figure 5D:
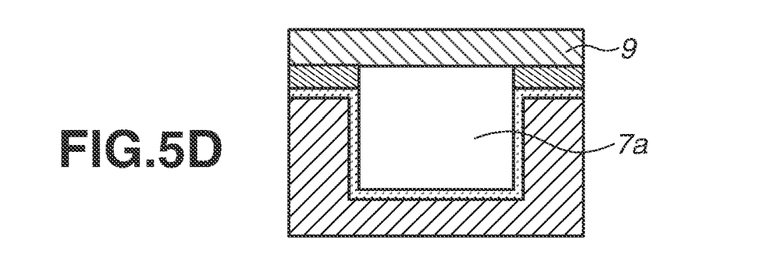
Figure 5E:
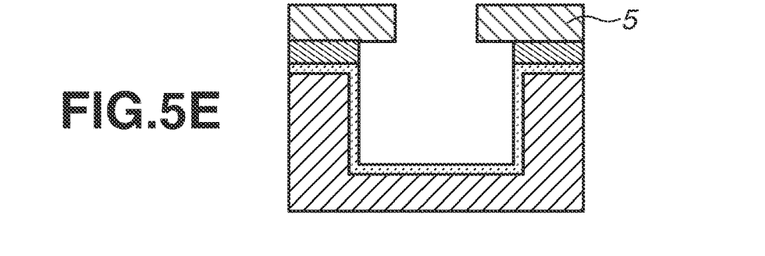

Thereafter, as described above with reference to FIGS. 2C and 2D, the photosensitive resin layer 9 is attached as illustrated in FIG. 5D and then irradiated with light. Further, the photosensitive resin layer 9 is developed to form a hole in the photosensitive resin layer 9 as illustrated in FIG. 5E to form the cover structure 5 to manufacture the structure. When the structure is manufactured, reflected light in the depressed portion 7 (the space 7a) is reduced by the layer 8. On the other hand, sufficient reflected light is obtained on the front surface 1a because the layer 11 is provided between the front surface 1a and the photosensitive resin layer 9 to improve the adhesion between the substrate 1 and the photosensitive resin layer 9.

The thickness of the layer 11 is desirably 10 nm or greater. Having a thickness of 10 nm or greater, coatability of the layer 11 on the front surface 1a (on the layer 8 on the front surface 1a) can be improved. The thickness of the layer 11 is desirably 700 nm or less. If the layer 11 is thicker than 700 nm, it can take a long time to form the layer 11. Further, the thickness of the layer 8 is desirably 200 nm or less. Having a thickness of 200 nm or less, the layer 8 can be easily adjusted to have a uniform layer thickness, and the reflectance can be easily controlled.

As described above, the layer 11 is formed such that the reflectance of the layer in which the layers 8 and are laminated is higher than the reflectance of the layer 8 located within the depressed portion 7 (on the space side) with respect to the light of the wavelength with which the photosensitive resin layer 9 is irradiated. The reflectance of a second layer, which is the layer on the front surface 1a (in the illustrated example, the layer in which the layers 8 and 11 are laminated) is desirably higher by 10% or more, more desirably 20% or more, than the reflectance of a first layer, which is the layer within the depressed portion 7 (in the illustrated example, one layer of the layer 8). If the reflectance of the second layer is excessively high, the hole in the cover structure 5 can be adversely affected. Thus, the reflectance of the second layer is desirably not higher than 10 times the reflectance of the first layer. Incidentally, the front surface 1a of the substrate 1 refers to a surface that is different from the surface forming the depressed portion 7 (space 7a) and is located outside the depressed portion 7.

Figure 6A:
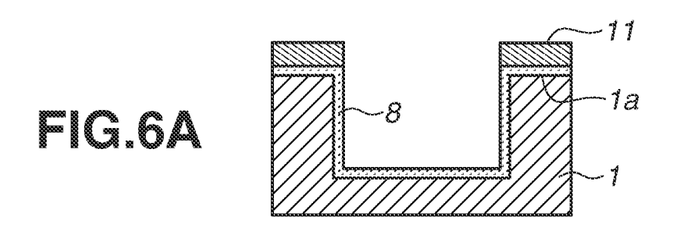
FIGS. 6A to 6D illustrate a cross section of a substrate of a liquid ejection head.

The layer 11 can be formed using other patterns. FIGS. 6A to 6D illustrate the patterns with reference to the cross section of the substrate 1 of the liquid ejection head. The pattern illustrated in FIG. 6A is similar to the pattern described above with reference to FIG. 5C.

Figure 6B:
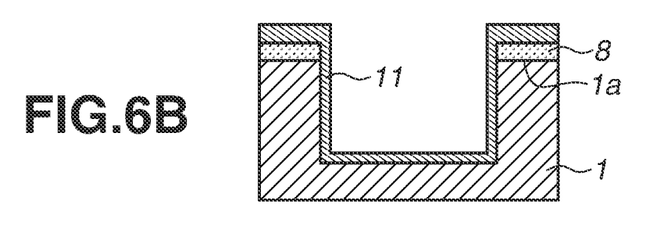

FIG. 6B illustrates the pattern in which the layer 8 is formed on the front surface 1a but is not formed within the depressed portion and the layer 11 is formed within the depressed portion and on the front surface 1a. Even in this case, the thickness and material of each layer can be adjusted such that the reflectance of the second layer (in the illustrated example, the layer in which the layers 8 and 11 are laminated) on the front surface 1a is higher than the reflectance of the first layer (in the illustrated example, one layer of the layer 11) within the depressed portion.

Figure 6C:
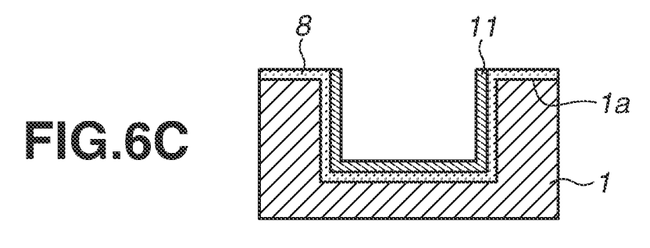
Figure 6D:
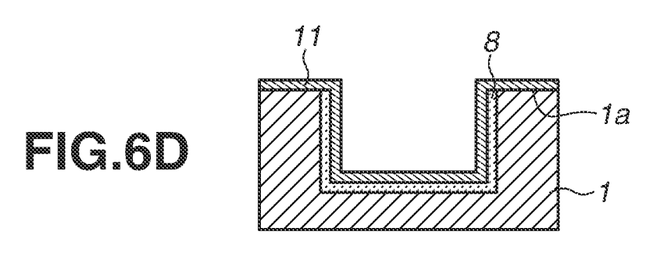

In FIG. 6C, the layer 8 is provided within the depressed portion and on the front surface 1a. On the other hand, the layer 11 is provided within the depressed portion but is not provided on the front surface 1a. On the contrary, in FIG. 6D, the layer 8 is provided within the depressed portion but is not provided on the front surface 1a, and the layer 11 is provided within the depressed portion and on the front surface 1a. In both cases, the thickness and material of each layer can be adjusted such that the reflectance of the second layer on the front surface 1a is higher than the reflectance of the first layer within the depressed portion.

Various examples will be described below.

The following describes a first exemplary embodiment. A structure was manufactured as illustrated in FIGS. 2A to 2E.

As illustrated in FIG. 2A, the substrate 1 including the depressed portion 7 was prepared. The substrate 1 is a silicon substrate made of monocrystalline silicon. The depressed portion 7 was formed by conducting reactive ion etching on the substrate 1.

Next, as illustrated in FIG. 2B, the layer 8 of titanium oxide was formed by ALD using a SUNALE R-200 (product name, manufactured by Picosun). The layer 8 of titanium oxide was formed to coat the depressed portion 7 and be located on the front surface 1a of the substrate 1. The layer 8 of titanium oxide was measured at 49 points to obtain the following results. Specifically, the thickness was 84 nm to 102 nm, and the average was 93 nm. The refractive index was 2.811. The extinction coefficient was 0.031. The reflectance of the layer 8 was as specified in FIG. 3. The reflectance with respect to the i-line was 40% or less at every one of the points, and the average reflectance of the 49 points, i.e., the reflectance of the layer 8, was 2.8%. Thus, the reflectance of the layer 8 is the average reflectance measured at arbitrary 40 or more points of the layer 8.

Next, as illustrated in FIG. 2C, the photosensitive resin layer 9 was provided on the substrate to cover the depressed portion 7. The photosensitive resin layer 9 was formed by applying 10 μm of TMMR S2000 (product name, manufactured by TOKYO OHKA KOGYO CO., LTD.) using spin coating onto a ZeonorFilm ZF16 (product name, manufactured by Zeon Corporation) as the base film. The photosensitive resin layer 9 was laminated using a lamination apparatus at a stage temperature of 40 degrees Celsius, a roller temperature of 40 degrees Celsius, a roller pressure of 0.1 MPa, and a roller speed of 50 mm/s, and was provided on the substrate 1 to cover the depressed portion 7. The depressed portion 7 was formed into the space 7a surrounded by the substrate 1 and the photosensitive resin layer 9.

After the photosensitive resin layer 9 was formed on the substrate 1, the region of the photosensitive resin layer 9 that was located above the space 7a surrounded by the substrate 1 and the photosensitive resin layer 9 was irradiated with the irradiation light. The layer 8 was provided on the surface of the substrate 1 facing the space 7a, as illustrated in FIG. 2D. The light irradiation was conducted using an i-line exposure apparatus to apply the i-line through the base film (not illustrated).

Thereafter, the base film was removed, followed by heating at 90 degrees Celsius for 300 seconds to partially cure the photosensitive resin layer 9. Next, the developing was conducted using propyleneglycol-1-monomethylether-2-acetate to form the hole 5a. In this way, the photosensitive resin layer 9 was formed into the cover structure 5 to manufacture the structure.

The shape of the hole 5a in the structure was observed with an electron microscope. In the observation, no shape defect was recognized, and it was confirmed that the hole 5a was formed in the desired shape. Further, the state of adhesion between the substrate 1 and the cover structure 5 was checked after ink immersion, and partial detachment of the cover structure 5 was observed.

The following describes a second exemplary embodiment. A liquid ejection head was manufactured as a structure as illustrated in FIGS. 4A to 4F.

First, as illustrated in FIG. 4A, the channel mold members 10 and the ejection opening forming member 4 were provided on the silicon substrate 1 including the energy generation elements 2 made of TaSiN. The ejection opening forming member 4 coats the mold members 10 and forms the ejection openings 4a.

A positive photosensitive resin ODUR-1010 (product name, manufactured by TOKYO OHKA KOGYO CO., LTD.) was applied onto the substrate 1 by spin coating and heated at 120 degrees Celsius for 3 minutes on a hot plate and then at 150 degrees Celsius for 30 minutes in an oven purged with nitrogen. The thickness of the positive photosensitive resin layer on the substrate 1 was 14 μm. The positive photosensitive resin layer was irradiated with deep-ultraviolet (UV) light in an exposure amount of 18000 mJ/cm$^2$ through the mask using a deep-UV exposure apparatus UX-3000 (product name, manufactured by USHIO INC.). Thereafter, developing processing was conducted using a mixed solution of methyl isobutyl ketone/xylene=2/3 (mass ratio), and rinsing treatment was conducted using xylene to form the mold members 10 on the substrate 1.

Next, the mold members 10 were coated with a negative photosensitive resin composition having the following composition.

100 parts by mass of EHPE (product name, manufactured by Daicel Corporation)

5 parts by mass of SP-172 (product name, manufactured by ADEKA CORPORATION)

5 parts by mass of A-187 (product name, manufactured by Dow Corning Toray Co., Ltd.)

100 parts by mass of methyl isobutyl ketone

The negative photosensitive resin composition was applied by spin coating and heated at 90 degrees Celsius for 3 minutes on a hot plate to have a thickness of 10 μm on the mold members 10. Then, the irradiation with ultraviolet radiation in an exposure amount of 3000 mJ/cm$^2$ was conducted through a photomask using a mask aligner MPA600FA (product name, manufactured by Canon Inc.). Thereafter, heating at 90 degrees Celsius was conducted for 180 seconds to cure the negative photosensitive resin composition. Then, develop processing was conducted using the solution of methyl isobutyl ketone/xylene=2/3 (mass ratio), and rinse processing was conducted using xylene to form the ejection openings 4a.

Next, as illustrated in FIG. 4B, reactive ion etching was conducted on the substrate 1 to form the first supply openings 3 and the second supply openings 6. The first supply openings 3 and the second supply openings 6 are the depressed portion formed in the substrate 1.

Next, as illustrated in FIG. 4C, the layer 8 of titanium oxide was formed by ALD using the SUNALE R-200 (product name, manufactured by Picosun). The layer 8 of titanium oxide was formed to coat the depressed portion 7 and located on the front surface 1a of the substrate 1. The thickness of titanium oxide measured like the first example was from 84 nm to 102 nm, and the average was 93 nm. The refractive index was 2.811. The extinction coefficient was 0.031. The reflectance of the layer 8 with respect to the i-line was 2.8%.

Next, as illustrated in FIG. 4D, the photosensitive resin layer 9 was provided on the substrate 1 to cover the depressed portion. The photosensitive resin layer 9 was formed by applying 10 μm of TMMR S2000 (product name, manufactured by TOKYO OHKA KOGYO CO., LTD.) using spin coating onto a ZeonorFilm ZF16 (product name, manufactured by Zeon Corporation) serving as the base film. The photosensitive resin layer 9 was laminated using a lamination apparatus at a stage temperature of 40 degrees Celsius, a roller temperature of 40 degrees Celsius, a roller pressure of 0.1 MPa, and a roller speed of 50 mm/s and was provided on the substrate 1 to cover the depressed portion 7. The depressed portion 7 was formed into the space 7a surrounded by the substrate 1 and the photosensitive resin layer 9.

Next, the photosensitive resin layer 9 was irradiated with the light and developed to form the cover structure 5 as illustrated in FIG. 4E. The light irradiation was conducted using an i-line exposure apparatus to apply the i-line through the base film (not illustrated). After the light irradiation, the base film was removed, followed by heating at 90 degrees Celsius for 300 seconds to partially cure the photosensitive resin layer 9. The layer 9 was developed using propyleneglycol-1-monomethylether-2-acetate to form the cover structure 5 including the hole 5a.

Next, a region including the mold members 10 was irradiated with deep-UV light, and the mold members 10 were developed using methyl lactate to form the channels. Lastly, heating at 200 degrees Celsius was conducted for 1 hour to manufacture the liquid ejection head.

The shape of the hole 5a in the liquid ejection head was observed with an electron microscope. In the observation, no shape defect was recognized, and it was confirmed that the hole 5a was formed in the desired shape.

The following describes a third exemplary embodiment. A structure was manufactured as illustrated in FIGS. 5A to 5E.

The process illustrated in FIGS. 5A and 5B is similar to the process illustrated in FIGS. 2A and 2B according to the first example. Specifically, the layer 8 having a reflectance of 40% or less with respect to the i-line was formed in the depressed portion 7.

Next, as illustrated in FIG. 5C, the layer 11 made of SiC was formed by the CVD method on the layer 8 on the front surface 1a. The average thickness of the layer was 40 nm. The refractive index was 2.331. The extinction coefficient was 0.221. The layer 11 was not formed in the depressed portion 7.

In this state, the reflectance of the first layer (one layer of the layer 8) in the depressed portion 7 with respect to the i-line was 40% or less, specifically 2.8%. On the other hand, the reflectance of the second layer (the layer in which the layers 8 and 11 were laminated) on the front surface 1a with respect to the i-line was 35.1%.

Next, as illustrated in FIG. 5D, the photosensitive resin layer 9 was provided on the substrate to cover the depressed portion 7. The photosensitive resin layer 9 was formed by applying 10 μm of TMMR S2000 (product name, manufactured by TOKYO OHKA KOGYO CO., LTD.) using spin coating onto a ZeonorFilm ZF16 (product name, manufactured by Zeon Corporation) serving as the base film. The photosensitive resin layer 9 was laminated using a lamination apparatus at a stage temperature of 40 degrees Celsius, a roller temperature of 40 degrees Celsius, a roller pressure of 0.1 MPa, and a roller speed of 50 mm/s and was provided on the substrate 1 to cover the depressed portion 7. The depressed portion 7 was formed into the space 7a surrounded by the substrate 1 and the photosensitive resin layer 9.

Thereafter, the hole 5a was formed in the photosensitive resin layer 9 as in the first example. In this way, the photosensitive resin layer 9 was formed into the cover structure 5, and the structure was manufactured.

The shape of the hole 5a in the structure was observed with an electron microscope. In the observation, no shape defect was recognized, and it was confirmed that the hole 5a was formed in the desired shape. Further, the state of adhesion between the substrate 1 and the cover structure 5 was checked after ink immersion, and no detachment was observed.

The following describes a fourth exemplary embodiment. A structure was manufactured like the third example, except that the average thickness of the layer 11 was 13 nm. The reflectance of the second layer (the layer in which the layers 8 and 11 were laminated) on the front surface 1a with respect to the i-line was not lower than 12%.

Thereafter, the hole 5a was formed in the photosensitive resin layer 9 like the third example. In this way, the photosensitive resin layer 9 was formed into the cover structure 5, and the structure was manufactured.

The shape of the hole 5a in the structure was observed with an electron microscope. In the observation, no shape defect was recognized, and it was confirmed that the hole 5a was formed in the desired shape. Further, the state of adhesion between the substrate 1 and the cover structure 5 was checked after ink immersion, and no detachment was observed.

The following describes a fifth exemplary embodiment. A structure was manufactured like the third example, except that the average thickness of the layer 8 was 45 nm and the average thickness of the layer 11 was 17 nm. The reflectance of the first layer (one layer of the layer 8) in the depressed portion 7 with respect to the i-line was 39.2%. The reflectance of the second layer (the layer in which the layers 8 and 11 were laminated) on the front surface 1a with respect to the i-line was 51.2%.

The shape of the hole 5a in the structure was observed with an electron microscope. In the observation, no shape defect was recognized, and it was confirmed that the hole 5a was formed in the desired shape. Further, the state of adhesion between the substrate 1 and the cover structure 5 was checked after ink immersion, and no detachment was observed.

The following describes a sixth example. A structure was manufactured like the first example, except that the thickness of the layer 8 was 700 nm to 980 nm and the average was 840 nm. The reflectance of the layer 8 with respect to the i-line was 25.1%.

The shape of the hole 5a in the structure was observed with an electron microscope. In the observation, no shape defect was recognized, and it was confirmed that the hole 5a was formed in the desired shape. However, it took 155 hours to form the layer 8.

COMPARATIVE EXAMPLE 1

A structure was manufactured like the first example, except that the thickness of the layer 8 was 49 nm to 69 nm and the average was 59 nm. The reflectance of the layer 8 with respect to the i-line was 57.4%.

The shape of the hole 5a in the structure was observed with an electron microscope. In the observation, a shape defect was recognized, and it was confirmed that a part of the hole was not suitably opened.

COMPARATIVE EXAMPLE 2

A structure was manufactured like the first example, except that the thickness of the layer 8 was 159 nm to 221 nm and the average was 190 nm. The reflectance of the layer 8 with respect to the i-line was 53.1%.

The shape of the hole 5a in the structure was observed with an electron microscope. In the observation, a shape defect was recognized, and it was confirmed that a part of the hole was not opened, especially in a portion showing a high reflectance.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-150410, filed Jul. 29, 2016, which is hereby incorporated by reference herein in its entirety.

What is claimed is:

1. A method of manufacturing a structure including a substrate and a photosensitive resin layer provided on the substrate, the method comprising:

irradiating a region of the photosensitive resin layer with light in a state where a layer is provided on a surface of the substrate, the region being located above a space surrounded by the substrate and the photosensitive resin layer, and the surface facing the space; and removing a portion of the photosensitive resin layer located above the space to form a hole, wherein the provided layer has a reflectance of 40% or less with respect to the light, wherein the substrate is made of silicon, wherein the space surrounded by the substrate and the photosensitive resin layer is a space that is enclosed at the bottom and side by the substrate and is enclosed at top by the photosensitive resin layer, and wherein the bottom and the side of the space are coated with the layer.

2. The method according to claim 1, wherein the provided layer has a refractive index of 1.5 or larger with respect to the light.

3. The method according to claim 1, wherein the provided layer is made of an inorganic compound containing at least one element selected from the group consisting of oxygen, nitrogen, and carbon.

4. The method according to claim 1, wherein the provided layer is made of at least one member selected from the group consisting of titanium oxide, zirconium oxide, hafnium oxide, vanadium oxide, niobium oxide, and tantalum oxide.

5. The method according to claim 1, wherein the provided layer includes one layer.

6. The method according to claim 1, wherein the provided layer includes two or more layers.

7. The method according to claim 1, wherein the provided layer is formed by using an atomic layer deposition method.

8. The method according to claim 1, wherein the provided layer has a thickness from 10 nm to 200 nm.

9. The method according to claim 1, wherein the photosensitive resin layer is a layer containing a negative photosensitive resin.

10. The method according to claim 1, wherein the light is ultraviolet radiation.

11. The method according to claim 1, wherein the light is an i-line.

12. The method according to claim 1, wherein a second layer is provided between the substrate and the photosensitive resin layer and on a surface of the substrate that is different from the surface facing the space, and a reflectance of the second layer with respect to the light is higher than the reflectance of the provided layer as a first layer with respect to the light.

13. The method according to claim 12, wherein the reflectance of the second layer with respect to the light is higher by 10% or more than the reflectance of the first layer with respect to the light.

14. The method according to claim 12, wherein the reflectance of the second layer with respect to the light is higher by 20% or more than the reflectance of the first layer with respect to the light.

15. A method of manufacturing a liquid ejection head including a substrate including a supply opening for supplying liquid and a cover structure provided on the substrate, the method comprising:

irradiating a region of a photosensitive resin layer with light in a state where a layer is provided on a surface of the substrate, the region being located above a space surrounded by the substrate and the photosensitive resin layer, and the surface facing the space; and removing a portion of the photosensitive resin layer located above the space to form a hole so that the space forms the supply opening and the photosensitive resin layer forms the cover structure, wherein the provided layer has a reflectance of 40% or less with respect to the light, wherein the substrate is made of silicon, wherein the space surrounded by the substrate and the photosensitive resin layer is a space that is enclosed at bottom and side by the substrate and is enclosed at top by the photosensitive resin layer, and wherein the bottom and the side of the space are coated with the layer.

* * * * *